United States Patent
Dong et al.

(10) Patent No.: US 11,431,193 B2
(45) Date of Patent: Aug. 30, 2022

(54) POWER FLOW ANALYSIS DEVICE AND POWER FLOW ANALYSIS METHOD FOR AC/DC HYBRID SYSTEM

(71) Applicant: TSINGHUA UNIVERSITY, Beijing (CN)

(72) Inventors: Xinzhou Dong, Beijing (CN); Haonan Wang, Beijing (CN); Boliang Jin, Beijing (CN)

(73) Assignee: TSINGHUA UNIVERSITY, Beijing (CN)

( * ) Notice: Subject to any disclaimer, the term of this patent is extended or adjusted under 35 U.S.C. 154(b) by 238 days.

(21) Appl. No.: 17/005,372

(22) Filed: Aug. 28, 2020

(65) Prior Publication Data
US 2021/0328457 A1  Oct. 21, 2021

(30) Foreign Application Priority Data
Apr. 17, 2020  (CN) .......................... 202010307640.2

(51) Int. Cl.
*H02J 13/00* (2006.01)
*G01R 21/133* (2006.01)
*H02J 4/00* (2006.01)

(52) U.S. Cl.
CPC .... *H02J 13/00002* (2020.01); *G01R 21/1331* (2013.01); *H02J 4/00* (2013.01); *H02J 2203/20* (2020.01)

(58) Field of Classification Search
CPC .... H02J 13/00002; H02J 4/00; H02J 2203/20; G01R 21/1331
See application file for complete search history.

(56) References Cited

U.S. PATENT DOCUMENTS 6,400,108 B1 * 6/2002 Chen ................. H02P 6/10
  318/400.23
11,355,704 B2 * 6/2022 Wu ................. H01L 45/1675
(Continued)

FOREIGN PATENT DOCUMENTS

CN  106410835 A  2/2017
CN  107994583 A  5/2018
(Continued)

OTHER PUBLICATIONS

Guo, X. et al., "Practical Calculator Method for Multi-infeed Short Circuit Ratio Influenced by Characteristics of External Characteristics of DC System", Proceedings of the CSEE, May 5, 2015, pp. 2143-2151, vol. 35, No. 9.
(Continued)

*Primary Examiner* — Manuel A Rivera Vargas
(74) *Attorney, Agent, or Firm* — Scully Scott Murphy & Presser

(57) ABSTRACT

The present disclosure proposes a power flow analysis device and a power flow analysis method for an AC/DC hybrid system. Wherein, the device comprises: a memory being stored a computer program; and a processor performing the following steps when executing the computer program: obtaining an AC system voltage and a commutation reaction of the DC transmission system, a first trigger angle of the rectifier, and a second trigger angle of the inverter; constructing an AC equivalent model according to the AC system voltage, the commutation reaction, the first trigger angle, and the second trigger angle; and performing a power flow calculation according to the AC equivalent model to obtain a power flow analysis result of the AC/DC hybrid system. Therefore, the power flow analysis and calculation problem of the AC/DC hybrid system is transformed into the power flow analysis and calculation problem of the pure AC system, which overcomes the problem that the DC system
(Continued)

variables are not easily decoupled in the power flow analysis and calculation, and takes into account the efficiency and accuracy of the power flow calculation.

10 Claims, 5 Drawing Sheets

(56) References Cited

U.S. PATENT DOCUMENTS

2020/0081044 A1\* 3/2020 Li ..................... G01R 21/003
2020/0119679 A1\* 4/2020 Zhu ........................ H02P 9/00

FOREIGN PATENT DOCUMENTS

CN 109449965 A 3/2019
CN 109462237 A 3/2019

OTHER PUBLICATIONS

Dong, X. et al., "Confronting Problem and Challenge of Large Scale AC-DC Hybrid Power Grid Operation", Proceedings of the CSEE, Jun. 5, 2019, pp. 3107-3118, vol. 39, No. 11.

Mustafa, M.W. et al., "A modified approach for load flow analysis of integrated AC-DC power systems", 2000 TENCON proceedings, Aug. 6, 2002, pp. II-108 to II-113.

First Office Action dated Apr. 6, 2021 received in Chinese Patent Application No. CN 202010307640.2 together with an English language translation.

\* cited by examiner

POWER FLOW ANALYSIS DEVICE AND POWER FLOW ANALYSIS METHOD FOR AC/DC HYBRID SYSTEM

PRIORITY CLAIM AND RELATED APPLICATION

The present application claims the priority of Chinese Application No. 202010307640.2, filed in the Chinese Patent Office on Apr. 17, 2020, and entitled "POWER FLOW ANALYSIS DEVICE AND POWER FLOW ANALYSIS METHOD FOR AC/DC HYBRID SYSTEM", the entirety of which is herein incorporated by reference.

FIELD

The present disclosure relates to the technical field of refrigeration or heat pump system, and in particular, relates to a power flow analysis device for AC/DC hybrid system and a power flow analysis method for AC/DC hybrid system.

BACKGROUND

China's energy and load distribution have opposite characteristics, in order to meet the needs of economic development and environmental protection, large-scale, long-distance power energy transmission mainly based on high-voltage DC transmission system has been significantly developed, the AC/DC hybrid system has become a new form of system development. The transmission system presents a trend from the pure AC system to the AC/DC hybrid system, the complexity of the system has been significantly improved, the power flow analysis and calculation method of the pure AC system represented by the traditional Newton-Raphson method can no longer meet the demand. At present, there are two main power flow algorithms for AC/DC hybrid system that are unified iteration method and alternating iteration method. The unified iteration method has better convergence accuracy, but the calculation time is longer, and it is difficult to calculate complex networks and adjust the DC operation mode. The alternative solution method has better flexibility and higher efficiency, but it does not consider the coupling between the DC variables and the AC variables, and the convergence is not good.

SUMMARY

The present disclosure aims to solve at least one of the technical problems existing in the prior art or related technologies.

To this end, the first aspect of the present disclosure is to propose a power flow analysis device for an AC/DC hybrid system.

The second aspect of the present disclosure is to propose a power flow analysis method for an AC/DC hybrid system.

In view of this, according to the first aspect of the present disclosure, an AC/DC hybrid system power flow analysis device is proposed, the AC/DC hybrid system comprises a DC transmission system, the DC transmission system comprises a converter station having a rectifier and an inverter, wherein the power flow analysis device comprises: a memory being stored a computer program; and a processor performing the following steps when executing the computer program: obtaining an AC system voltage and a commutation reaction of the DC transmission system, a first trigger angle of the rectifier, and a second trigger angle of the inverter; constructing an AC equivalent model according to the AC system voltage, the commutation reaction, the first trigger angle, and the second trigger angle; and performing a power flow calculation according to the AC equivalent model to obtain a power flow analysis result of the AC/DC hybrid system.

The power flow analysis device for the AC/DC hybrid system provided by the present disclosure, uses the DC transmission system structural parameters (the trigger angle) and control parameters (the commutation reactance, the AC system voltage) to construct an AC equivalent model of the high-voltage DC transmission system, and then by solving the AC equivalent model, to obtain the power flow distribution of the AC/DC hybrid system, thereby transforming the power flow analysis and calculation problem of the AC/DC hybrid system into the power flow analysis and calculation problem of the pure AC system, and overcoming the problem that the DC system variables are not easily decoupled in the power flow analysis and calculation, it can quickly, correctly and conveniently analyze and calculate the power flow distribution of the complex AC/DC hybrid system during steady-state operation, thereby taking into account the efficiency and accuracy of the power flow calculation. Wherein, the AC system voltage is the voltage of the connection node between the DC transmission system and the AC transmission system.

In addition, the power flow analysis device for the AC/DC hybrid system in the above technical solution provided by the present disclosure may also have the following additional technical features.

In the above technical solution, further, the commutation reaction comprises a commutation reaction on rectification side and a commutation reaction on inverter side, the processor executes a step of constructing an AC equivalent model according to the AC system voltage, the commutation reaction, the first trigger angle and the second trigger angle when executing the computer program, the step specifically comprises: determining an equivalent transformation ratio of the DC transmission system according to the AC system voltage, the commutation reaction on rectification side, the commutation reaction on inverter side, the first trigger angle, and the second trigger angle; according to the commutation reaction on rectification side, the commutation reaction on inverter side, the first trigger angle, the second trigger angle and the equivalent transformation ratio, to calculate a first ratio of an effective value of equivalent AC current of the DC transmission system and an AC voltage of the DC transmission system, and a second ratio of an AC current active component of the DC transmission system and the effective value of equivalent AC current respectively; calculating a third ratio of an AC current reactive component of the DC transmission system and the effective value of equivalent AC current according to the second ratio; calculating an AC reactance according to the first ratio and the third ratio; and constructing the AC equivalent model according to the AC reactance.

In the technical solution, based on the principle of the equal DC voltage in the DC transmission system, to calculate a first ratio of an effective value of equivalent AC current of the DC transmission system and an AC voltage of the DC transmission system, and based on the principle of the equal active power on AC/DC sides of the converter station to calculate the second ratio of the AC current active component and the effective value of equivalent AC current of the DC transmission system, and then calculating a third ratio of an AC current reactive component of the DC transmission system and the effective value of equivalent AC current according to the second ratio; calculating an AC reactance according to the first ratio and the third ratio, using the AC reactance equivalent converter station to get the AC equivalent model of high-voltage DC transmission system, thus the DC transmission system in the AC/DC hybrid system is equivalent to the AC transmission system expressed by the structural parameters and control parameters of the DC transmission system, carrying out the power flow analysis and calculation of the pure AC system makes the power flow analysis and calculation of the AC/DC hybrid system have higher sensitivity and reliability, and overcomes the problem that the DC system variables are not easily decoupled in the power flow analysis and calculation, it can quickly, correctly and conveniently analyze and calculate the power flow distribution of the complex AC/DC hybrid system during steady-state operation, thereby taking into account the efficiency and accuracy of power flow calculation.

In any of the above technical solutions, further, wherein the AC voltage comprises an AC voltage on rectification side and an AC voltage on inverter side; the processor executes a step of calculating a first ratio of the effective value of equivalent AC current of the DC transmission system and the AC voltage of the DC transmission system when executing the computer program, the step specifically comprises: the formula (1) is used to calculate a first ratio on rectification side of the effective value of equivalent AC current and the AC voltage on rectification side, and a first ratio on inverter side of the effective value of equivalent AC current and the AC voltage on inverter side;

$$\begin{cases} k_{iur} = \dfrac{\sqrt{6}\left(\cos\alpha - \dfrac{\cos\beta}{k}\right)}{3(X_r + X_i)} \\ k_{iui} = \dfrac{\sqrt{6}\,(k\cos\alpha - \cos\beta)}{3(X_r + X_i)} \end{cases} \quad (1)$$

wherein, $k_{iur}$ represents the first ratio on rectification side, $k_{iui}$ represents the first ratio on inverter side, $\alpha$ represents the first trigger angle, $\beta$ represents the second trigger angle, k represents the equivalent transformation ratio, and $X_r$ represents the commutation reaction on rectification side, $X_i$ represents the commutation reaction on inverter side, the AC current active component comprises an AC current active component on rectification side and an AC current active component on inverter side; the processor executes a step of calculating a second ratio of the AC current active component and the effective value of equivalent AC current when executing the computer program, the step specifically comprises: the formula (2) is used to calculate a second ratio on rectification side of the AC current active component on rectification side and the effective value of equivalent AC current, and a second ratio on inverter side of the AC current active component on inverter side and the effective value of equivalent AC current;

$$\begin{cases} k_{irpi} = \dfrac{3\sqrt{6}\left(X_i\cos\alpha + \dfrac{X_r\cos\beta}{k}\right)}{\pi(X_r + X_i)} \\ k_{iipi} = \dfrac{3\sqrt{6}\,(kX_i\cos\alpha + X_r\cos\beta)}{\pi(X_r + X_i)} \end{cases} \quad (2)$$

wherein, $k_{irpi}$ represents the second ratio on rectification side, and $k_{iipi}$ represents the first ratio on inverter side;

the AC current reactive component comprises an AC current reactive component on rectification side and an AC current reactive component on inverter side; the processor executes a step of calculating a third ratio of the AC current reactive component of the DC transmission system and the effective value of equivalent AC current according to the second ratio when executing the computer program, the step specifically comprises: the formula (3) is used to calculate a third ratio on rectification side of the AC current reactive component on rectification side and the effective value of equivalent AC current according to the second ratio on rectification side, and to calculate a third ratio on inverter side of the AC current reactive component on inverter side and the effective value of equivalent AC current according to the second ratio on inverter side;

$$\begin{cases} k_{irqi} = \sqrt{6 - k_{irpi}^2} \\ k_{iiqi} = \sqrt{6 - k_{iipi}^2} \end{cases} \quad (3)$$

wherein, $k_{irqi}$ represents the third ratio on rectification side and $k_{iipi}$ represents the third ratio on inverter side.

In the technical solution, based on the principle of the equal DC voltage in the DC transmission system, calculating a first ratio on rectification side of an effective value of equivalent AC current and the AC voltage on rectification side, and a first ratio on inverter side of the effective value of equivalent AC current and the AC voltage on inverter side respectively; based on the principle that the active power on the AC/DC side of the converter station are equal, calculating a second ratio on rectification side of the AC current active component on rectification side and the effective value of equivalent AC current, and a second ratio on inverter side of the AC current active component on inverter side and the effective value of equivalent AC current; and then according to the second ratio on rectification side and the second ratio on inverter side, to calculate the corresponding a third ratio on rectification side of the AC current reactive component on rectification side and the effective value of equivalent AC current according to the second ratio on rectification side, and a third ratio on inverter side of the AC current reactive component on inverter side and the effective value of equivalent AC current according to the second ratio on inverter side; in order to calculate the equivalent AC reactance of the DC transmission system according to the first ratio and the third ratio, so that the AC reactance equivalent converter station can be used to obtain the AC equivalent model of the high-voltage DC transmission system, so as to carry out the power flow analysis and calculation of the pure AC system, while ensuring the efficiency and accuracy of the power flow analysis and calculation of the AC/DC hybrid system.

In any of the above technical solutions, further, wherein the processor executes a step of calculating the AC reactance according to the first ratio and the third ratio when executing the computer program, the step specifically comprises: the formula (4) is used to calculate a first AC reactance, a second AC reactance and a third AC reactance.

$$\begin{cases} X_1 = \dfrac{k-1}{kk_{iur}k_{irqi} + k_{iui}k_{iiqi}} \\ X_2 = \dfrac{1-k}{k(kk_{iur}k_{irqi} + k_{iui}k_{iiqi})} \\ X_3 = \dfrac{1}{kk_{iur}k_{irqi} + k_{iui}k_{iiqi}} \end{cases} \quad (4)$$

Wherein, $X_1$ represents the first AC reactance, $X_2$ represents the second AC reactance, and $X_3$ represents the third AC reactance; and/or the formula (5) is used to calculate a fourth AC reactance and a fifth AC reactance.

$$\begin{cases} X_{qr} = \dfrac{1}{k_{iur}k_{irqi}} \\ X_{qi} = \dfrac{1}{k_{iui}k_{iiqi}} \end{cases} \quad (5)$$

Wherein, $X_{qr}$ represents the fourth AC reactance, and $X_{qi}$ represents the fifth AC reactance.

In the technical solution, through the first ratio on rectification side, the first ratio on inverter side, the equivalent transformation ratio, the third ratio on rectification side, the third ratio on inverter side, to calculate the three-phase AC reactance (the first AC reactance, the second AC reactance and the third AC reactance), therefore, according to the three-phase AC reactance, an equivalent model of the impedance parameter matrix of the full line comprising the DC transmission system and the converter station is constructed, and then a power flow calculation is performed through the equivalent model of the impedance parameter matrix of the full line, thereby, the DC transmission system is equivalent to the AC transmission system, to carry out the power flow analysis and calculation of the pure AC system, to improve the sensitivity and reliability of the power flow analysis and calculation of the AC/DC hybrid system. Of course, it can also calculate the fourth AC reactance, that is, the AC reactance on rectification side, through the first ratio on rectification side and the third ratio on rectification side, and calculate the fifth AC reactance, that is, that is the AC reactance on inverter side, through the first ratio on inverter side and the third ratio on inverter side, thereby the equivalent reactance model of the converter station can be constructed, and then converting the power flow calculation problem of the DC transmission system according to the equivalent reactance model of the converter station.

In any of the above technical solutions, further, wherein the processor executes a step of performing a power flow calculation according to the AC equivalent model to obtain a power flow analysis result of the AC/DC hybrid system when executing the computer program, the step specifically comprises:

solving the AC equivalent model to obtain an effective value of AC voltage and a DC voltage of the DC transmission system;

calculating a reactive loss of the rectifier and a reactive loss of the inverter according to the effective value of AC voltage, the first ratio and the third ratio;

calculating an equivalent AC current according to the DC current and a voltage phase on rectification side, and determining the effective value of equivalent AC current according to the equivalent AC current; and generating the power flow analysis result of the AC/DC hybrid system according to the effective value of equivalent AC current, the reactive loss of the rectifier and the reactive loss of the inverter;

wherein the formula (6) is used to calculate the reactive loss of the rectifier and the reactive loss of the inverter.

$$\begin{cases} \Delta Q_{rac} = k_{iur}k_{irqi}U_r^2 \\ \Delta Q_{iac} = k_{iui}k_{iiqi}U_i^2 \end{cases} \quad (6)$$

wherein, $\Delta Q_{rac}$ represents the reactive loss of the rectifier, $\Delta Q_{iac}$ represents the reactive loss of the inverter, $U_r$ represents the effective value of AC voltage on rectification side, $U_i$ represents the effective value of AC voltage on inverter side;

the formula (7) is used to calculate the equivalent AC current;

$$I_{dac} = \dfrac{I_d}{3} \angle \varphi_{ur} \quad (7)$$

wherein, $\varphi_{ur}$ represents the voltage phase on rectification side, $I_d$ represents the DC current of the DC transmission system, and $I_{dac}$ represents the equivalent AC current.

In the technical solution, based on the principle that the power before and after the equivalent is unchanged, the converter station is regarded as a reactive load, and the power of the DC transmission system is averaged to three-phase AC, in other words, the effective value is one third of the DC current of the DC transmission system, using the DC current and the voltage phase on rectification side, to calculate the equivalent AC current, so the DC current of the DC transmission system is equivalent to the AC current, and determining the effective value of equivalent AC current based on the equivalent AC current, at the same time, according to the effective value of AC voltage, the first ratio and the third ratio, the reactive power loss of the converter station during steady-state operation of the transmission system is calculated, through the sum of the reactive power losses and the effective value of equivalent AC current, the power flow analysis result of the AC/DC hybrid system is generated to provide a reliable reference basis for the equivalent power flow analysis and calculation, thereby it can quickly, correctly and conveniently analyze and calculate the power flow distribution of the complex AC/DC hybrid system during steady-state operation to meet the analysis needs of users. Wherein, the effective value of AC voltage on rectification side is the voltage of the rectifier node, and the effective value of AC voltage on inverter side is the voltage of the inverter node.

In any of the above technical solutions, further, the processor executes a step of determining the equivalent transformation ratio of the DC transmission system according to the AC system voltage, the commutation reaction on rectification side, the commutation reaction on inverter side, the first trigger angle, and the second trigger angle when executing the computer program, the step specifically comprises:

determining the initial equivalent coefficient according to the ratio of the AC system voltage on rectification side and the AC system voltage on inverter side;

bringing the initial equivalent coefficient, the commutation reaction on rectification side, the commutation reaction on inverter side, the first trigger angle and the second trigger angle into the following equation to solve the equivalent transformation ratio of the DC transmission system;

$$(k^2 - k_0^2) +$$
$$\frac{4(k \cos \alpha - \cos \beta)}{\pi(X_r - X_i)^2} \left[ X_r \sqrt{k^2\pi^2(X_r + X_i)^2 - 9(kX_i \cos \alpha + X_r \cos \beta)^2} - k_0^2 X_i \sqrt{\pi^2(X_r + X_i)^2 - 9(kX_i \cos \alpha + X_r \cos \beta)^2} \right] +$$
$$\frac{4(k \cos \alpha - \cos \beta)^2}{(X_r + X_i)^2}(X_r^2 - k_0^2 X_i^2) = 0$$

wherein, $k_0$ represents the initial equivalent coefficient, $k_0 = U_{gr}/U_{gi}$, $U_{gr}$ represents the AC system voltage on rectification side, and $U_{gi}$ represents the AC system voltage on inverter side.

According to the second aspect of the present disclosure, a power flow analysis method for an AC/DC hybrid system is proposed, the power flow analysis method comprises the following steps: obtaining an AC system voltage and a commutation reaction of the DC transmission system, a first trigger angle of the rectifier, and a second trigger angle of the inverter; constructing an AC equivalent model according to the AC system voltage, the commutation reaction, the first trigger angle, and the second trigger angle; and performing a power flow calculation according to the AC equivalent model to obtain a power flow analysis result of the AC/DC hybrid system.

The power flow analysis method for the AC/DC hybrid system provided by the present disclosure, uses the DC transmission system structural parameters (the trigger angle) and control parameters (the commutation reactance, the AC system voltage) to construct an AC equivalent model of the high-voltage DC transmission system, and then by solving the AC equivalent model, to obtain the power flow distribution of the AC/DC hybrid system, thereby transforming the power flow analysis and calculation problem of the AC/DC hybrid system into the power flow analysis and calculation problem of the pure AC system, and overcoming the problem that the DC system variables are not easily decoupled in the power flow analysis and calculation, it can quickly, correctly and conveniently analyze and calculate the power flow distribution of the complex AC/DC hybrid system during steady-state operation, thereby taking into account the efficiency and accuracy of the power flow calculation. Wherein, the AC system voltage is the voltage of the connection node between the DC transmission system and the AC transmission system.

In addition, the power flow analysis method for the AC/DC hybrid system in the above technical solution provided by the present disclosure may also have the following additional technical features.

In the above technical solution, further, wherein the commutation reaction comprises a commutation reaction on the rectification side and a commutation reaction on inverter side, executing a step of constructing an AC equivalent model according to the AC system voltage, the commutation reaction, the first trigger angle and the second trigger angle, the step specifically comprises: determining an equivalent transformation ratio of the DC transmission system according to the AC system voltage, the commutation reaction on rectification side, the commutation reaction on inverter side, the first trigger angle, and the second trigger angle; according to the commutation reaction on rectification side, the commutation reaction on inverter side, the first trigger angle, the second trigger angle and the equivalent transformation ratio, to calculate a first ratio of an effective value of equivalent AC current of the DC transmission system and an AC voltage of the DC transmission system, and a second ratio of an AC current active component of the DC transmission system and the effective value of equivalent AC current respectively; calculating a third ratio of an AC current reactive component of the DC transmission system and the effective value of equivalent AC current according to the second ratio; calculating an AC reactance according to the first ratio and the third ratio; and constructing the AC equivalent model according to the AC reactance.

In the technical solution, based on the principle of the equal DC voltage in the DC transmission system, to calculate a first ratio of an effective value of equivalent AC current of the DC transmission system and an AC voltage of the DC transmission system, and based on the principle of the equal active power on the AC and DC sides of the converter station to calculate the second ratio of the AC current active component and the effective value of equivalent AC current of the DC transmission system, and then calculating a third ratio of an AC current reactive component of the DC transmission system and the effective value of equivalent AC current according to the second ratio; calculating an AC reactance according to the first ratio and the third ratio, using the AC reactance equivalent converter station to get the AC equivalent model of high-voltage DC transmission system, thus the DC transmission system in the AC/DC hybrid system is equivalent to the AC transmission system expressed by the structural parameters and control parameters of the DC transmission system, carrying out the power flow analysis and calculation of the pure AC system makes the power flow analysis and calculation of the AC/DC hybrid system have higher sensitivity and reliability.

In any of the above technical solutions, further, wherein the AC voltage comprises an AC voltage on rectification side and an AC voltage on inverter side; executing a step of calculating a first ratio of the effective value of equivalent AC current of the DC transmission system and the AC voltage of the DC transmission system, the step specifically comprises: the formula (1) is used to calculate a first ratio on rectification side of the effective value of equivalent AC current and the AC voltage on rectification side, and a first ratio on inverter side of the effective value of equivalent AC current and the AC voltage on inverter side;

$$\begin{cases} k_{iur} = \frac{\sqrt{6}\left(\cos \alpha - \frac{\cos \beta}{k}\right)}{3(X_r + X_i)} \\ k_{iui} = \frac{\sqrt{6}(k \cos \alpha - \cos \beta)}{3(X_r + X_i)} \end{cases} \quad (1)$$

wherein, $k_{iur}$ represents the first ratio on rectification side, $k_{iui}$ represents the first ratio on inverter side, α represents the first trigger angle, β represents the second trigger angle, k represents the equivalent transformation ratio, and $X_r$ represents the commutation reaction on rectification side, $X_i$ represents the commutation reaction on inverter side;

the AC current active component comprises an AC current active component on rectification side and an AC current active component on inverter side; executing a step of calculating a second ratio of the AC current active component and the effective value of equivalent AC current, the step specifically comprises: the formula (2) is used to calculate a second ratio on rectification side of the AC current active component on rectification side and the effective value of equivalent AC current, and a second ratio on inverter side of the AC current active component on inverter side and the effective value of equivalent AC current;

$$\begin{cases} k_{irpi} = \dfrac{3\sqrt{6}\left(X_i \cos \alpha + \dfrac{X_r \cos \beta}{k}\right)}{\pi(X_r + X_i)} \\ k_{iipi} = \dfrac{3\sqrt{6}\,(kX_i \cos \alpha + X_r \cos \beta)}{\pi(X_r + X_i)} \end{cases} \quad (2)$$

wherein, $c_{hirpy}$ represents the second ratio on rectification side, and $k_{iipi}$ represents the first ratio on inverter side.

the AC current reactive component comprises an AC current reactive component on rectification side and an AC current reactive component on inverter side; executing a step of calculating a third ratio of an AC current reactive component of the DC transmission system and the effective value of equivalent AC current according to the second ratio, the step specifically comprises: the formula (3) is used to calculate a third ratio on rectification side of the AC current reactive component on rectification side and the effective value of equivalent AC current according to the second ratio on rectification side, and to calculate a third ratio on inverter side of the AC current reactive component on inverter side and the effective value of equivalent AC current according to the second ratio on inverter side;

$$\begin{cases} k_{irqi} = \sqrt{6 - k_{irpi}^2} \\ k_{iiqi} = \sqrt{6 - k_{iipi}^2} \end{cases} \quad (3)$$

wherein, $k_{irqi}$ represents the third ratio on rectification side and $k_{iipi}$ represents the third ratio on inverter side.

In the technical solution, based on the principle of the equal DC voltage in the DC transmission system, calculating a first ratio on rectification side of an effective value of equivalent AC current and the AC voltage on rectification side, and a first ratio on inverter side of the effective value of equivalent AC current and the AC voltage on inverter side respectively; based on the principle that the active power on the AC/DC side of the converter station are equal, calculating a second ratio on rectification side of the AC current active component on rectification side and the effective value of equivalent AC current, and a second ratio on inverter side of the AC current active component on inverter side and the effective value of equivalent AC current; and then according to the second ratio on rectification side and the second ratio on inverter side, to calculate the corresponding a third ratio on rectification side of the AC current reactive component on rectification side and the effective value of equivalent AC current according to the second ratio on rectification side, and a third ratio on inverter side of the AC current reactive component on inverter side and the effective value of equivalent AC current according to the second ratio on inverter side; in order to calculate the equivalent AC reactance of the DC transmission system according to the first ratio and the third ratio, so that the AC reactance equivalent converter station can be used to obtain the AC equivalent model of the high-voltage DC transmission system, so as to carry out the power flow analysis and calculation of the pure AC system, while ensuring the efficiency and accuracy of the power flow analysis and calculation of the AC/DC hybrid system.

In any of the above technical solutions, further, wherein executing a step of calculating the AC reactance according to the first ratio and the third ratio, the step specifically comprises:

the formula (4) is used to calculate a first AC reactance, a second AC reactance and a third AC reactance;

$$\begin{cases} X_1 = \dfrac{k-1}{kk_{iur}k_{irqi} + k_{iui}k_{iiqi}} \\ X_2 = \dfrac{1-k}{k(kk_{iur}k_{irqi} + k_{iui}k_{iiqi})} \\ X_3 = \dfrac{1}{kk_{iur}k_{irqi} + k_{iui}k_{iiqi}} \end{cases} \quad (4)$$

wherein, $X_1$ represents the first AC reactance, $X_2$ represents the second AC reactance, and $X_3$ represents the third AC reactance; and/or the formula (5) is used to calculate a fourth AC reactance and a fifth AC reactance;

$$\begin{cases} X_{qr} = \dfrac{1}{k_{iur}k_{irqi}} \\ X_{qi} = \dfrac{1}{k_{iui}k_{iiqi}} \end{cases} \quad (5)$$

wherein, $X_{qr}$ represents the fourth AC reactance, and $X_{qi}$ represents the fifth AC reactance.

In the technical solution, through the first ratio on rectification side, the first ratio on inverter side, the equivalent transformation ratio, the third ratio on rectification side, the third ratio on inverter side, to calculate the three-phase AC reactance (the first AC reactance, the second AC reactance and the third AC reactance), therefore, according to the three-phase AC reactance, an equivalent model of the impedance parameter matrix of the full line comprising the DC transmission system and the converter station is constructed, and then a power flow calculation is performed through the equivalent model of the impedance parameter matrix of the full line, thereby, the DC transmission system is equivalent to the AC transmission system, to carry out the power flow analysis and calculation of the pure AC system, to improve the sensitivity and reliability of the power flow analysis and calculation of the AC/DC hybrid system. Of course, it can also calculate the fourth AC reactance, that is, the AC reactance on rectification side, through the first ratio on rectification side and the third ratio on rectification side, and calculate the fifth AC reactance, that is, that is the AC reactance on inverter side, through the first ratio on inverter side and the third ratio on inverter side, thereby the equivalent reactance model of the converter station can be constructed, and then converting the power flow calculation problem of the DC transmission system according to the equivalent reactance model of the converter station.

In any of the above technical solutions, further, wherein executing a step of performing a power flow calculation according to the AC equivalent model to obtain a power flow analysis result of the AC/DC hybrid system, the step specifically comprises:

solving the AC equivalent model to obtain an effective value of AC voltage and a DC voltage of the DC transmission system;

calculating a reactive loss of the rectifier and a reactive loss of the inverter according to the effective value of AC voltage, the first ratio and the third ratio;

calculating an equivalent AC current according to the DC current and a voltage phase on rectification side, and determining the effective value of equivalent AC current according to the equivalent AC current; and generating the power flow analysis result of the AC/DC hybrid system according to the effective value of equivalent AC current, the reactive loss of the rectifier and the reactive loss of the inverter;

wherein the formula (6) is used to calculate the reactive loss of the rectifier and the reactive loss of the inverter;

$$\begin{cases} \Delta Q_{rac} = k_{iur}k_{irqi}U_r^2 \\ \Delta Q_{iac} = k_{iui}k_{iiqi}U_i^2 \end{cases} \quad (6)$$

wherein, $\Delta Q_{rac}$ represents the reactive loss of the rectifier, $\Delta Q_{iac}$ represents the reactive loss of the inverter, $U_r$ represents the effective value of AC voltage on rectification side, $U_i$ represents the effective value of AC voltage on inverter side;

the formula (7) is used to calculate the equivalent AC current;

$$I_{dac} = \frac{I_d}{3} \angle \varphi_{ur} \quad (7)$$

wherein, $\varphi_{ur}$ represents the voltage phase on rectification side, $I_d$ represents the DC current of the DC transmission system, and $I_{dac}$ represents the equivalent AC current.

In the technical solution, based on the principle that the power before and after the equivalent is unchanged, the converter station is regarded as a reactive load, and the power of the DC transmission system is averaged to three-phase AC, in other words, the effective value is one third of the DC current of the DC transmission system, using the DC current and the voltage phase on rectification side, to calculate the equivalent AC current, so the DC current of the DC transmission system is equivalent to the AC current, and determining the effective value of equivalent AC current based on the equivalent AC current, at the same time, according to the effective value of AC voltage, the first ratio and the third ratio, the reactive power loss of the converter station during steady-state operation of the transmission system is calculated, through the sum of reactive power losses and the effective value of equivalent AC current, the power flow analysis result of the AC/DC hybrid system is generated to provide a reliable reference basis for the equivalent power flow analysis and calculation, thereby it can quickly, correctly and conveniently analyze and calculate the power flow distribution of the complex AC/DC hybrid system during steady-state operation to meet the analysis needs of users. Wherein, the effective value of AC voltage on rectification side is the voltage of the rectifier node, and the effective value of AC voltage on inverter side is the voltage of the inverter node.

In any of the above technical solutions, further, the processor executes a step of determining the equivalent transformation ratio of the DC transmission system according to the AC system voltage, the commutation reaction on rectification side, the commutation reaction on inverter side, the first trigger angle, and the second trigger angle when executing the computer program, the step specifically comprises:

determining the initial equivalent coefficient according to the ratio of the AC system voltage on rectification side and the AC system voltage on inverter side;

bringing the initial equivalent coefficient, the commutation reaction on rectification side, the commutation reaction on inverter side, the first trigger angle and the second trigger angle into the following equation to solve the equivalent transformation ratio of the DC transmission system.

$$(k^2 - k_0^2) + \frac{4(k\cos\alpha - \cos\beta)}{\pi(X_r - X_i)^2}\left[X_r\sqrt{k^2\pi^2(X_r + X_i)^2 - 9(kX_i\cos\alpha + X_r\cos\beta)^2} - k_0^2 X_i\sqrt{\pi^2(X_r + X_i)^2 - 9(kX_i\cos\alpha + X_r\cos\beta)^2}\right] + \frac{4(k\cos\alpha - \cos\beta)^2}{(X_r + X_i)^2}(X_r^2 - k_0^2 X_i^2) = 0$$

wherein, $k_0$ represents the initial equivalent coefficient, $k_0 = U_{gr}/U_{gi}$, $U_{gr}$ represents the AC system voltage on rectification side, and $U_{gi}$ represents the AC system voltage on inverter side.

Additional aspects and advantages of the present disclosure will become apparent in the following description, or are understood by the practice of the present disclosure.

BRIEF DESCRIPTION OF THE DRAWINGS

The above and/or additional aspects and advantages of the present disclosure will become apparent and readily understood from the following description of embodiments in conjunction with the drawings.

DETAILED DESCRIPTION OF EMBODIMENTS

In order that the above-mentioned objectives, features and advantages of the present disclosure can be understood more clearly, a further detailed description of the present disclosure will be given below in connection with the accompanying drawings and specific embodiments. It should be noted that the embodiments of the present disclosure and the features in the embodiments can be combined with each other if there is no conflict.

In the following description, numerous specific details are set forth in order to provide a thorough understanding of the present disclosure. However, the present disclosure can also be implemented in other manners than those described herein. Therefore, the protection scope of the present disclosure is not limited to the specific embodiments disclosed below.

The following describes a power flow analysis device and a power flow analysis method of an AC/DC hybrid system according to some embodiments of the present disclosure with reference to FIGS. 1 to 8.

Embodiment 1

Figure 1:
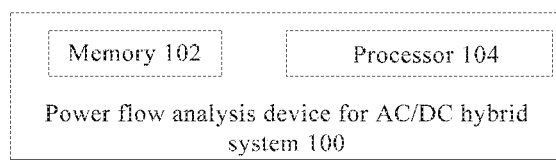
FIG. 1 shows a schematic structural diagram of a power flow analysis device for an AC/DC hybrid system according to an embodiment of the present disclosure.

As shown in FIG. 1, according to an embodiment of the first aspect of the present disclosure, a power flow analysis device 100 for an AC/DC hybrid system is proposed, comprising a memory 102 and a processor 104.

Specifically, the memory 102 stores a computer program, the processor 104 performs the following steps when executing a computer program: obtaining an AC system voltage and a commutation reaction of the DC transmission system, a first trigger angle of the rectifier, and a second trigger angle of the inverter; constructing an AC equivalent model according to the AC system voltage, the commutation reaction, the first trigger angle, and the second trigger angle; and performing a power flow calculation according to the AC equivalent model to obtain a power flow analysis result of the AC/DC hybrid system.

In this embodiment, using the DC transmission system structural parameters (the trigger angle) and control parameters (the commutation reactance, the AC system voltage) to construct an AC equivalent model of the high-voltage DC transmission system, and then by solving the AC equivalent model, to obtain the power flow distribution of the AC/DC hybrid system, thereby transforming the power flow analysis and calculation problem of the AC/DC hybrid system into the power flow analysis and calculation problem of the pure AC system, and overcoming the problem that the DC system variables are not easily decoupled in the power flow analysis and calculation, it can quickly, correctly and conveniently analyze and calculate the power flow distribution of the complex AC/DC hybrid system during steady-state operation, thereby taking into account the efficiency and accuracy of the power flow calculation.

Further, the processor 104 executes a step of determining the equivalent transformation ratio of the DC transmission system according to the AC system voltage, the commutation reaction on rectification side, the commutation reaction on inverter side, the first trigger angle, and the second trigger angle when executing the computer program, the step specifically comprises:

determining the initial equivalent coefficient according to the ratio of the AC system voltage on rectification side and the AC system voltage on inverter side;

bringing the initial equivalent coefficient, the commutation reaction on rectification side, the commutation reaction on inverter side, the first trigger angle and the second trigger angle into the following equation to solve the equivalent transformation ratio of the DC transmission system;

$$(k^2 - k_0^2) + \frac{4(k\cos\alpha + \cos\beta)}{\pi(X_r + X_i)^2}\left[X_r\sqrt{k^2\pi^2(X_r + X_i)^2 - 9(KX_i\cos\alpha + X_r\cos\beta)^2} - k_0^2 X_i\sqrt{\pi^2(X_r + X_i)^2 - 9(KX_i\cos\alpha + X_r\cos\beta)^2}\right] + \frac{4(k\cos\alpha - \cos\beta)^2}{(X_r + X_i)^2}(X_r^2 - k_0^2 X_i^2) = 0$$

wherein, $k_0$ represents the initial equivalent coefficient, $k_0 = U_{gr}/U_{gi}$, $U_{gr}$ represents the AC system voltage on rectification side, and $U_{gi}$ represents the AC system voltage on inverter side.

Embodiment 2

According to an embodiment of the present disclosure, comprising the features defined in the above embodiments, further, the commutation reaction comprises a commutation reaction on rectification side and a commutation reaction on inverter side, the processor 104 executes a step of constructing an AC equivalent model according to the AC system voltage, the commutation reaction, the first trigger angle and the second trigger angle when executing the computer program, the step specifically comprises: determining an equivalent transformation ratio of the DC transmission system according to the AC system voltage, the commutation reaction on rectification side, the commutation reaction on inverter side, the first trigger angle, and the second trigger angle; according to the commutation reaction on rectification side, the commutation reaction on inverter side, the first trigger angle, the second trigger angle and the equivalent transformation ratio, to calculate a first ratio of an effective value of equivalent AC current of the DC transmission system and an AC voltage of the DC transmission system, and a second ratio of an AC current active component of the DC transmission system and the effective value of equivalent AC current respectively; calculating a third ratio of an AC current reactive component of the DC transmission system and the effective value of equivalent AC current according to the second ratio; calculating an AC reactance according to the first ratio and the third ratio; and constructing the AC equivalent model according to the AC reactance.

Further, the formula (1) is used to calculate a first ratio on rectification side of the effective value of equivalent AC current and the AC voltage on rectification side, and a first ratio on inverter side of the effective value of equivalent AC current and the AC voltage on inverter side;

$$\begin{cases} k_{iur} = \dfrac{\sqrt{6}\left(\cos\alpha - \dfrac{\cos\beta}{k}\right)}{3(X_r + X_i)} \\ k_{iui} = \dfrac{\sqrt{6}(k\cos\alpha - \cos\beta)}{3(X_r + X_i)} \end{cases} \quad (1)$$

wherein, $k_{iur}$ represents the first ratio on rectification side, $k_{iui}$ represents the first ratio on inverter side, $\alpha$ represents the first trigger angle, $\beta$ represents the second trigger angle, k represents the equivalent transformation ratio, and $X_r$ represents the commutation reaction on rectification side, $X_i$ represents the commutation reaction on inverter side, the formula (2) is used to calculate a second ratio on rectification side of the AC current active component on rectification side and the effective value of equivalent AC current, and a second ratio on inverter side of the AC current active component on inverter side and the effective value of equivalent AC current;

$$\begin{cases} k_{irpi} = \dfrac{3\sqrt{6}\left(X_i\cos\alpha + \dfrac{X_r\cos\beta}{k}\right)}{\pi(X_r + X_i)} \\ k_{iipi} = \dfrac{3\sqrt{6}\,(kX_i\cos\alpha + X_r\cos\beta)}{\pi(X_r + X_i)} \end{cases} \quad (2)$$

wherein, $k_{irpi}$ represents the second ratio on rectification side, and $k_{iipi}$ represents the first ratio on inverter side;

the formula (3) is used to calculate a third ratio on rectification side of the AC current reactive component on rectification side and the effective value of equivalent AC current according to the second ratio on rectification side, and to calculate a third ratio on inverter side of the AC current reactive component on inverter side and the effective value of equivalent AC current according to the second ratio on inverter side;

$$\begin{cases} k_{irqi} = \sqrt{6 - k_{irpi}^2} \\ k_{iiqi} = \sqrt{6 - k_{iipi}^2} \end{cases} \quad (3)$$

wherein, $k_{irqi}$ represents the third ratio on rectification side and $k_{iipi}$ represents the third ratio on inverter side.

the formula (4) is used to calculate a first AC reactance, a second AC reactance and a third AC reactance;

$$\begin{cases} X_1 = \dfrac{k-1}{kk_{iur}k_{irqi} + k_{iui}k_{iiqi}} \\ X_2 = \dfrac{1-k}{k(kk_{iur}k_{irqi} + k_{iui}k_{iiqi})} \\ X_3 = \dfrac{1}{kk_{iur}k_{irqi} + k_{iui}k_{iiqi}} \end{cases} \quad (4)$$

wherein, $X_1$ represents the first AC reactance, $X_2$ represents the second AC reactance, and $X_3$ represents the third AC reactance; and/or the formula (5) is used to calculate a fourth AC reactance and a fifth AC reactance;

$$\begin{cases} X_{qr} = \dfrac{1}{k_{iur}k_{irqi}} \\ X_{qi} = \dfrac{1}{k_{iui}k_{iiqi}} \end{cases} \quad (5)$$

wherein, $X_{qr}$ represents the fourth AC reactance, and $X_{qi}$ represents the fifth AC reactance.

In this embodiment, based on the principle of the equal DC voltage in the DC transmission system, calculating a first ratio on rectification side of an effective value of equivalent AC current and the AC voltage on rectification side, and a first ratio on inverter side of the effective value of equivalent AC current and the AC voltage on inverter side respectively; based on the principle of the equal active power on AC/DC side of the converter station, to calculate a second ratio on rectification side of the AC current active component on rectification side and the effective value of equivalent AC current, and a second ratio on inverter side of the AC current active component on inverter side and the effective value of equivalent AC current; and then according to the second ratio on rectification side and the second ratio on inverter side, to calculate the corresponding a third ratio on rectification side of the AC current reactive component on rectification side and the effective value of equivalent AC current according to the second ratio on rectification side, and a third ratio on inverter side of the AC current reactive component on inverter side and the effective value of equivalent AC current according to the second ratio on inverter side; and through the first ratio on rectification side, the first ratio on inverter side, the equivalent transformation ratio, the third ratio on rectification side, the third ratio on inverter side, to calculate the three-phase AC reactance(the first AC reactance, the second AC reactance and the third AC reactance), therefore, according to the three-phase AC reactance, an equivalent model of the impedance parameter matrix of the full line comprising the DC transmission system and the converter station is constructed, and then a power flow calculation is performed through the equivalent model of the impedance parameter matrix of the full line, or it can also calculate the fourth AC reactance, that is, the AC reactance on rectification side, through the first ratio on rectification side and the third ratio on rectification side, and calculate the fifth AC reactance, that is, that is the AC reactance on the inverter side, through the first ratio on inverter side and the third ratio on inverter side, thereby the equivalent reactance model of the converter station can be constructed, and then converting the power flow calculation problem of the DC transmission system according to the equivalent reactance model of the converter station. So that the AC reactance equivalent converter station can be used to obtain the AC equivalent model of the high-voltage DC transmission system, so as to carry out the power flow analysis and calculation of the pure AC system, while ensuring the efficiency and accuracy of the power flow analysis and calculation of the AC/DC hybrid system.

Embodiment 3

According to an embodiment of the present disclosure, comprising the features defined in the above embodiments, further: the processor 104 executes a step of performing a power flow calculation according to the AC equivalent model to obtain a power flow analysis result of the AC/DC hybrid system when executing the computer program, the step specifically comprises: solving the AC equivalent model to obtain an effective value of AC voltage and a DC voltage of the DC transmission system; calculating a reactive loss of the rectifier and a reactive loss of the inverter according to the effective value of AC voltage, the first ratio and the third ratio; calculating an equivalent AC current according to the DC current and a voltage phase on rectification side, and determining the effective value of equivalent AC current according to the equivalent AC current; and generating the power flow analysis result of the AC/DC hybrid system according to the effective value of equivalent AC current, the AC equivalent model, the reactive loss of the rectifier and the reactive loss of the inverter; wherein the formula (6) is used to calculate the reactive loss of the rectifier and the reactive loss of the inverter.

$$\begin{cases} \Delta Q_{rac} = k_{iur}k_{irqi}U_r^2 \\ \Delta Q_{iac} = k_{iui}k_{iiqi}U_i^2 \end{cases} \quad (6)$$

wherein, $\Delta Q_{rac}$ represents the reactive loss of the rectifier, $\Delta Q_{iac}$ represents the reactive loss of the inverter, $U_r$ represents the effective value of AC voltage on rectification side, $U_i$ represents the effective value of AC voltage on inverter side;

the formula (7) is used to calculate the equivalent AC current;

$$\dot{I}_{dac} = \frac{I_d}{3} \angle \varphi_{ur} \tag{7}$$

wherein, $\varphi_{ur}$ represents the voltage phase on rectification side, $I_d$ represents the DC current of the DC transmission system, and $\dot{I}_{dac}$ represents the equivalent AC current.

In this embodiment, based on the principle that the power before and after the equivalent is unchanged, the converter station is regarded as a reactive load, and the power of the DC transmission system is averaged to three-phase AC, in other words, the effective value is one third of the DC current of the DC transmission system, using the DC current and the voltage phase on rectification side, to calculate the equivalent AC current, so the DC current of the DC transmission system is equivalent to the AC current, and determining the effective value of equivalent AC current based on the equivalent AC current, at the same time, according to the effective value of AC voltage, the first ratio and the third ratio, the reactive power loss of the converter station during steady-state operation of the transmission system is calculated, through the sum of the reactive power losses and the effective value of equivalent AC current, the power flow analysis result of the AC/DC hybrid system is generated to provide a reliable reference basis for the equivalent power flow analysis and calculation, thereby it can quickly, correctly and conveniently analyze and calculate the power flow distribution of the complex AC/DC hybrid system during steady-state operation to meet the analysis needs of users.

Further, after obtaining the effective value of AC voltage on rectification side of the DC transmission system and the AC voltage on inverter side of the DC transmission system, according to the ratio of the effective value of AC voltage on rectification side and the effective value of AC voltage on inverter side of the DC transmission system, that is, $k=U_r/U_i$, verify the equivalent transformation ratio, in order to perform the equivalent calculation of DC transmission system again.

Embodiment 4

Figure 2:
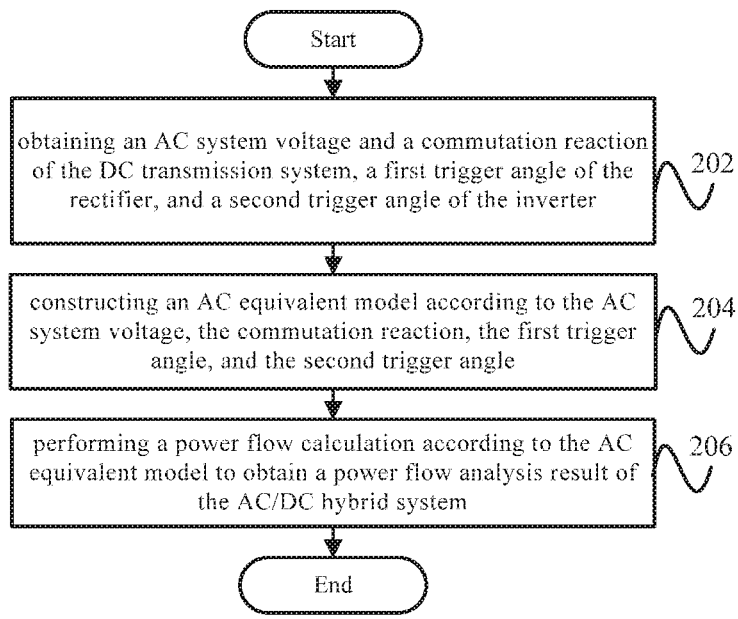
FIG. 2 shows a schematic flow chart of a power flow analysis method for an AC/DC hybrid system according to an embodiment of the present disclosure.

As shown in FIG. 2, according to an embodiment of the second aspect of the present disclosure, a power flow analysis method for an AC/DC hybrid system is proposed, which comprises:

Step 202: obtaining an AC system voltage and a commutation reaction of the DC transmission system, a first trigger angle of the rectifier, and a second trigger angle of the inverter;

Step 204: constructing an AC equivalent model according to the AC system voltage, the commutation reaction, the first trigger angle, and the second trigger angle;

Step 206: performing a power flow calculation according to the AC equivalent model to obtain a power flow analysis result of the AC/DC hybrid system.

In this embodiment, using the DC transmission system structural parameters (the trigger angle) and control parameters (the commutation reactance, the AC system voltage) to construct the AC equivalent model of the high-voltage DC transmission system and then by solving the AC equivalent model, the power flow distribution of the AC/DC hybrid system can be obtained. Therefore, the power flow analysis and calculation problem of AC/DC hybrid system is transformed into the power flow analysis and calculation problem of pure AC system, and overcomes the problem that DC system variables are not easily decoupled in the power flow analysis and calculation, it can quickly, correctly and conveniently analyze and calculate the power flow distribution of the complex AC/DC hybrid system during steady-state operation, thereby taking into account the efficiency and accuracy of the power flow calculation.

Embodiment 5

Figure 3:
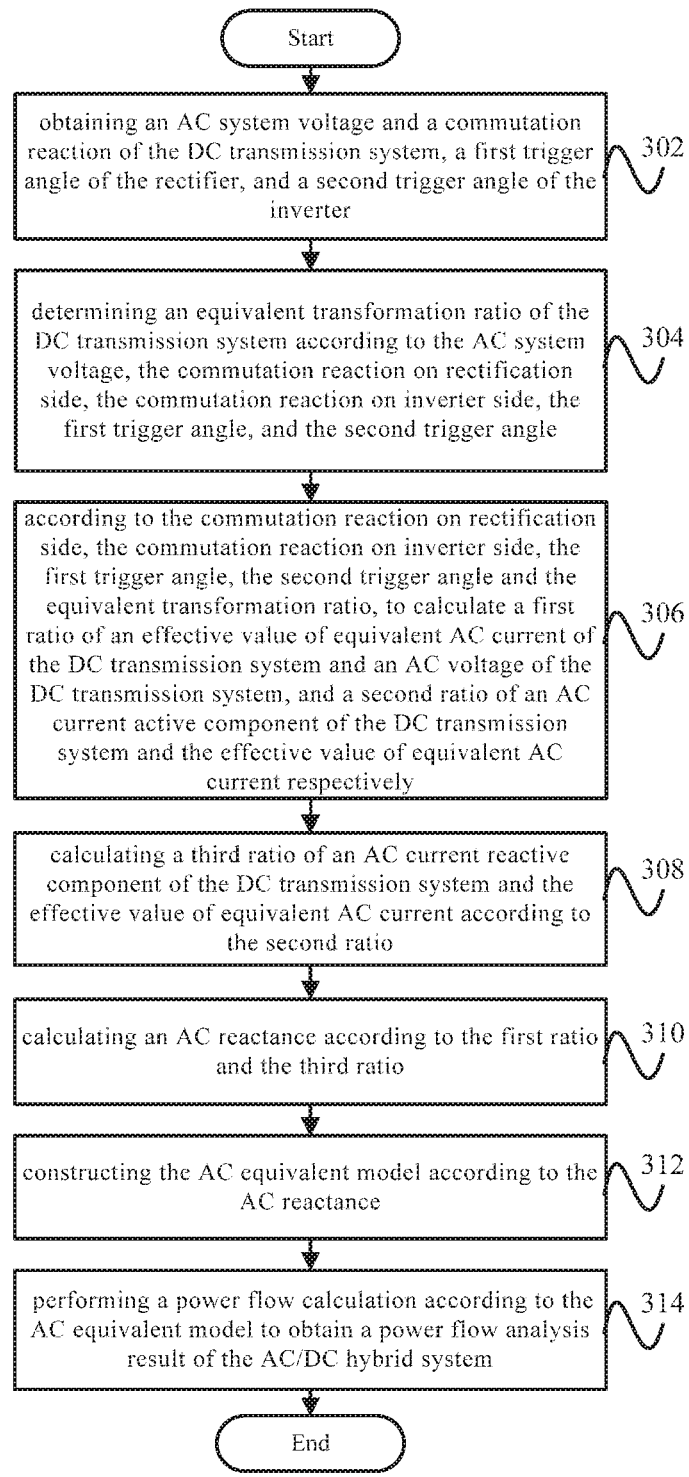
FIG. 3 shows a schematic flow chart of a power flow analysis method for an AC/DC hybrid system according to another embodiment of the present disclosure.

As shown in FIG. 3, according to an embodiment of the second aspect of the present disclosure, a power flow analysis method for an AC/DC hybrid system is proposed, which comprises:

Step 302: obtaining an AC system voltage and a commutation reaction of the DC transmission system, a first trigger angle of the rectifier, and a second trigger angle of the inverter;

Step 304: determining an equivalent transformation ratio of the DC transmission system according to the AC system voltage, the commutation reaction on rectification side, the commutation reaction on inverter side, the first trigger angle, and the second trigger angle;

Step 306: according to the commutation reaction on rectification side, the commutation reaction on inverter side, the first trigger angle, the second trigger angle and the equivalent transformation ratio, to calculate a first ratio of an effective value of equivalent AC current of the DC transmission system and an AC voltage of the DC transmission system, and a second ratio of an AC current active component of the DC transmission system and the effective value of equivalent AC current respectively;

Step 308: calculating a third ratio of an AC current reactive component of the DC transmission system and the effective value of equivalent AC current according to the second ratio;

Step 310: calculating an AC reactance according to the first ratio and the third ratio;

Step 312: constructing the AC equivalent model according to the AC reactance;

Step 314: performing a power flow calculation according to the AC equivalent model to obtain a power flow analysis result of the AC/DC hybrid system.

In this embodiment, based on the principle of the equal DC voltage in the DC transmission system, to calculate a first ratio of an effective value of equivalent AC current of the DC transmission system and an AC voltage of the DC transmission system, and based on the principle of the equal active power on AC/DC sides of the converter station to calculate the second ratio of the AC current active component and the effective value of equivalent AC current of the DC transmission system, and then calculating a third ratio of an AC current reactive component of the DC transmission system and the effective value of equivalent AC current according to the second ratio; calculating an AC reactance according to the first ratio and the third ratio, using the AC reactance equivalent converter station to get the AC equivalent model of high-voltage DC transmission system, by solving the AC equivalent model, the power flow distribution of the AC/DC hybrid system can be obtained, at the same time, according to the effective value of AC voltage, the first ratio and the third ratio, the reactive power loss of the converter station during steady-state operation of the transmission system is calculated, by combining the reactive power loss and the power flow distribution of the AC/DC hybrid system, the power flow analysis result of the AC/DC hybrid system is generated, it can quickly, correctly and conveniently analyze and calculate the power flow distribution of the complex AC/DC hybrid system during steady-state operation, thereby taking into account the efficiency and accuracy of the power flow calculation.

Embodiment 6

Figure 4:
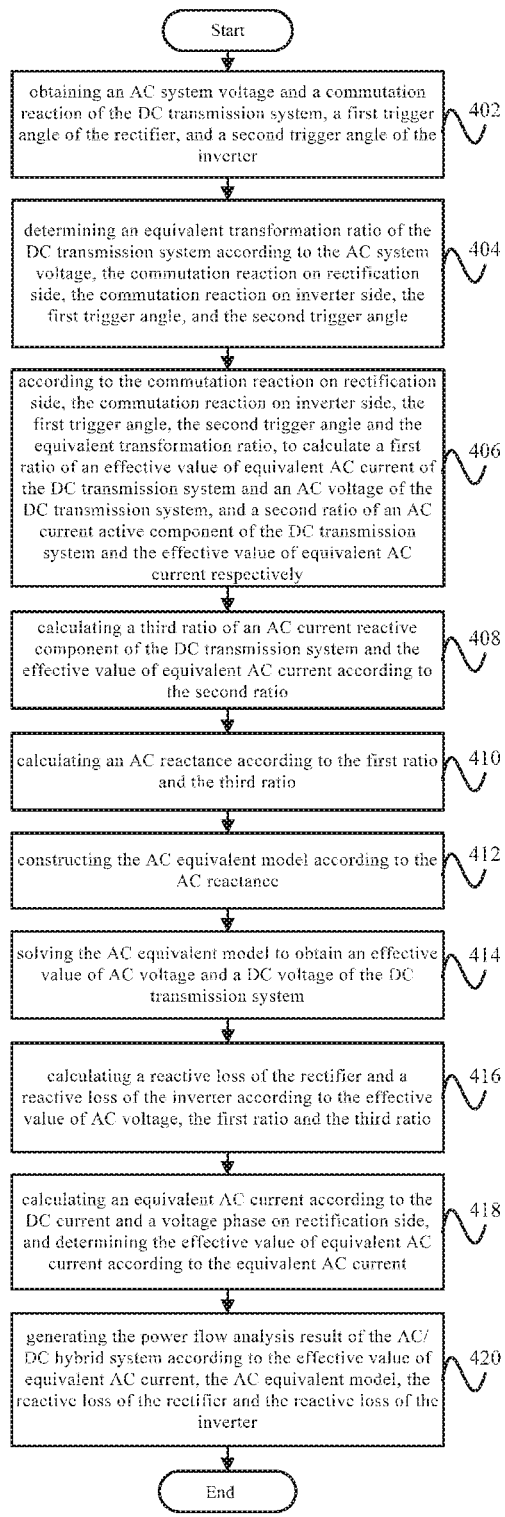
FIG. 4 shows a schematic flow chart of a power flow analysis method for an AC/DC hybrid system according to another embodiment of the present disclosure.

As shown in FIG. 4, according to an embodiment of the second aspect of the present disclosure, a power flow analysis method for an AC/DC hybrid system is proposed, which comprises:

Step 402: obtaining an AC system voltage and a commutation reaction of the DC transmission system, a first trigger angle of the rectifier, and a second trigger angle of the inverter;

Step 404: determining an equivalent transformation ratio of the DC transmission system according to the AC system voltage, the commutation reaction on rectification side, the commutation reaction on inverter side, the first trigger angle, and the second trigger angle;

Step 406: according to the commutation reaction on rectification side, the commutation reaction on inverter side, the first trigger angle, the second trigger angle and the equivalent transformation ratio, to calculate a first ratio of an effective value of equivalent AC current of the DC transmission system and an AC voltage of the DC transmission system, and a second ratio of an AC current active component of the DC transmission system and the effective value of equivalent AC current respectively;

Step 408: calculating a third ratio of an AC current reactive component of the DC transmission system and the effective value of equivalent AC current according to the second ratio;

Step 410: calculating an AC reactance according to the first ratio and the third ratio;

Step 412: constructing the AC equivalent model according to the AC reactance;

Step 414: solving the AC equivalent model to obtain an effective value of AC voltage and a DC voltage of the DC transmission system;

Step 416: calculating a reactive loss of the rectifier and a reactive loss of the inverter according to the effective value of AC voltage, the first ratio and the third ratio;

Step 418: calculating an equivalent AC current according to the DC current and a voltage phase on rectification side, and determining the effective value of equivalent AC current according to the equivalent AC current;

Step 420: generating the power flow analysis result of the AC/DC hybrid system according to the effective value of equivalent AC current, the AC equivalent model, the reactive loss of the rectifier and the reactive loss of the inverter.

In this embodiment, based on the principle that the power before and after the equivalent is unchanged, the converter station is regarded as a reactive load, and the power of the DC transmission system is averaged to three-phase AC, in other words, the effective value is one third of the DC current of the DC transmission system, using the DC current and the voltage phase on rectification side, to calculate the equivalent AC current, so the DC current of the DC transmission system is equivalent to the AC current, and determining the effective value of equivalent AC current based on the equivalent AC current, at the same time, according to the effective value of AC voltage, the first ratio and the third ratio, the reactive power loss of the converter station during steady-state operation of the transmission system is calculated, through the sum of the reactive power losses and the effective value of equivalent AC current, the power flow analysis result of the AC/DC hybrid system is generated to provide a reliable reference basis for the equivalent power flow analysis and calculation, thereby it can quickly, correctly and conveniently analyze and calculate the power flow distribution of the complex AC/DC hybrid system during steady-state operation to meet the analysis needs of users.

Embodiment 7

Figure 5:
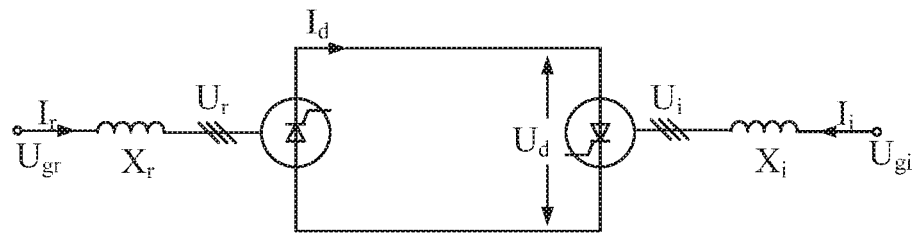
FIG. 5 shows a schematic diagram of an AC/DC hybrid system model of a specific embodiment of the present disclosure.

According to a specific embodiment of the present disclosure, a power flow analysis method for an AC/DC hybrid system is proposed, comprising an AC/DC hybrid system model based on MATLAB/Simulink simulation software, as shown in FIG. 5, the model parameters as shown in Table 1, the simulation time is 10 s.

TABLE 1

|  | rectification side (r) | inverter side (i) |
| --- | --- | --- |
| AC system voltage $U_g$ (kV) | 220 | 220 |
| AC side inductance L (H) | 0.151 | 0.0365 |
| trigger angle α/β (°) | 20 | 40 |

Based on the principle of the equal DC voltage in DC transmission system, based on the following formula (1):

$$\begin{cases} k_{iur} = \dfrac{\sqrt{6}\left(\cos\alpha - \dfrac{\cos\beta}{k}\right)}{3(X_r + X_i)} \\ k_{iui} = \dfrac{\sqrt{6}\,(k\cos\alpha - \cos\beta)}{3(X_r + X_i)} \end{cases} \quad (1)$$

using the commutation reactance $X_r$ on rectification side of the DC transmission system, the commutation reactance $X_i$ on inverter side of the DC transmission system, the trigger angle α of the rectifier of the DC transmission system and the trigger angle β of the inverter of the DC transmission system, to calculate the ratio $k_{iur}$ of the effective value $I_{dac}$ of the DC current equivalent AC current of the DC transmission system and the effective value $U_r$ of the AC voltage on rectification side of the DC transmission system, and the ratio $k_{iui}$ of the effective value $I_{dac}$ of the DC current equivalent AC current of the DC transmission system and the effective value $U_i$ of the AC voltage on inverter side of the DC transmission system.

Based on the principle of the equal active power on AC/DC sides of the converter station, based on the following formula (2):

$$\begin{cases} k_{irpi} = \dfrac{3\sqrt{6}\left(X_i\cos\alpha + \dfrac{X_r\cos\beta}{k}\right)}{\pi(X_r + X_i)} \\ k_{iipi} = \dfrac{3\sqrt{6}\,(kX_i\cos\alpha + X_r\cos\beta)}{\pi(X_r + X_i)} \end{cases} \quad (2)$$

calculating the ratio $k_{irpi}$ of the active component $I_{rp}$ of the AC current on rectification side of the DC transmission system and the effective value $I_{dac}$ of the DC current equivalent AC current of the DC transmission system, and the ratio $k_{iipi}$ of the active component $I_{ip}$ of the AC current on inverter side of the DC transmission system and the effective value $I_{dac}$ of the DC current equivalent AC current of the DC transmission system.

Based on the following formula (3):

$$\begin{cases} k_{irqi} = \sqrt{6 - k_{irpi}^2} \\ k_{iiqi} = \sqrt{6 - k_{iipi}^2} \end{cases} \quad (3)$$

calculating the reactive loss $\Delta Q_{rac}$ of the rectifier of the DC transmission system and the reactive loss $\Delta Q_{iac}$ of the inverter of the DC transmission system.

Based on the following formula (4)

$$\begin{cases} X_1 = \dfrac{k-1}{kk_{iur}k_{irqi} + k_{iui}k_{iiqi}} \\ X_2 = \dfrac{1-k}{k(kk_{iur}k_{irqi} + k_{iui}k_{iiqi})} \\ X_3 = \dfrac{1}{kk_{iur}k_{irqi} + k_{iui}k_{iiqi}} \end{cases} \quad (4)$$

calculating the AC reactance $X_1$, $X_2$ and $X_3$ of the equivalent model of the impedance parameter matrix of the full line.

Based on the following formula (5)

$$\begin{cases} X_{qr} = \dfrac{1}{k_{iur}k_{irqi}} \\ X_{qi} = \dfrac{1}{k_{iui}k_{iiqi}} \end{cases} \quad (5)$$

calculating the AC reactance $X_{qr}$ and $X_{qi}$ of the converter station equivalent reactance model.

Specifically, the equivalent transformation ratio of the DC transmission system is solved based on the following equation:

$$k^2 + 2kX_r k_{iui} k_{irqi} + 6X_r^2(k_{iui})^2 = k_0^2[1 + 2X_i k_{iui} k_{iiqi} + 6X_i^2 (k_{iui})^2]$$

Putting the formula (1) and the formula (3) into the equation and after simplification, the following equation is obtained:

$$(k^2 - k_0^2) + \frac{4(k\cos\alpha + \cos\beta)}{\pi(X_r + X_i)^2}\left[X_r\sqrt{k^2\pi^2(X_r+X_i)^2 - 9(kX_i\cos\alpha + X_r\cos\beta)^2}\right.$$
$$\left. - k_0^2 X_i\sqrt{\pi^2(X_r+X_i)^2 - 9(kX_i\cos\alpha + X_r\cos\beta)^2}\right] +$$
$$\frac{4(k\cos\alpha - \cos\beta)^2}{(X_r + X_i)^2}(X_r^2 - k_0^2 X_i^2) = 0$$

Bringing the initial equivalent coefficient $k_0$, the commutation reactance $X_r$ on rectification side, the commutation reactance $X_i$ on inverter side, the trigger angle $\alpha$ of the rectifier and the trigger angle $\beta$ of the inverter into the following equation to obtain the equivalent transformation ratio of the DC transmission system;

wherein $k_0 = U_{gr}/U_{gi}$, $U_{gr}$ represents the AC system voltage on rectification side, $U_{gi}$ represents the AC system voltage on inverter side.

Figure 6:
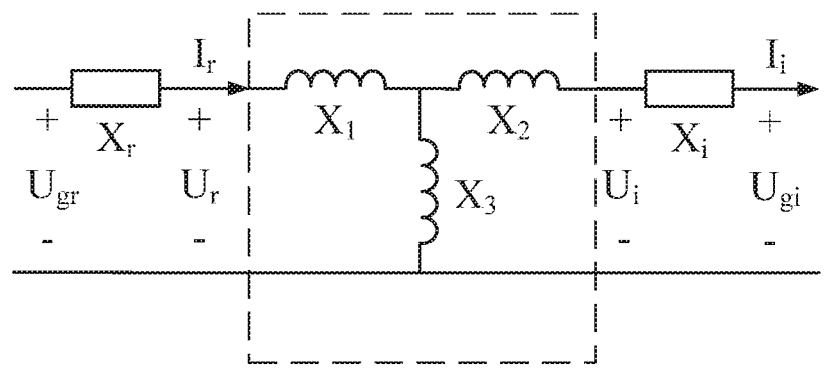
FIG. 6 shows a schematic diagram of an equivalent model of the impedance parameter matrix of the full line of a specific embodiment of the present disclosure.
Figure 7:
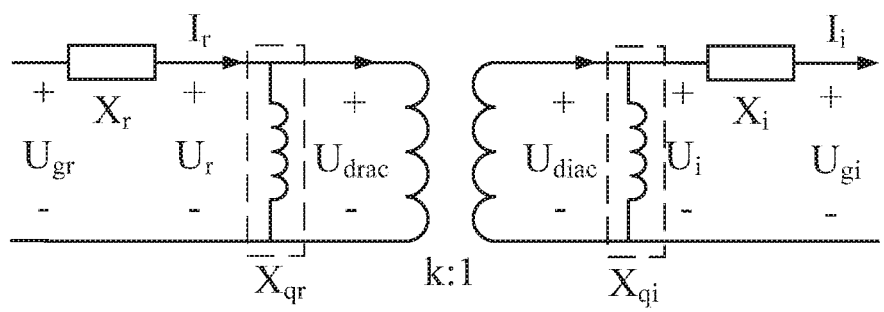
FIG. 7 shows a schematic diagram of a converter station equivalent reactance model of a specific embodiment of the present disclosure.
Figure 8:
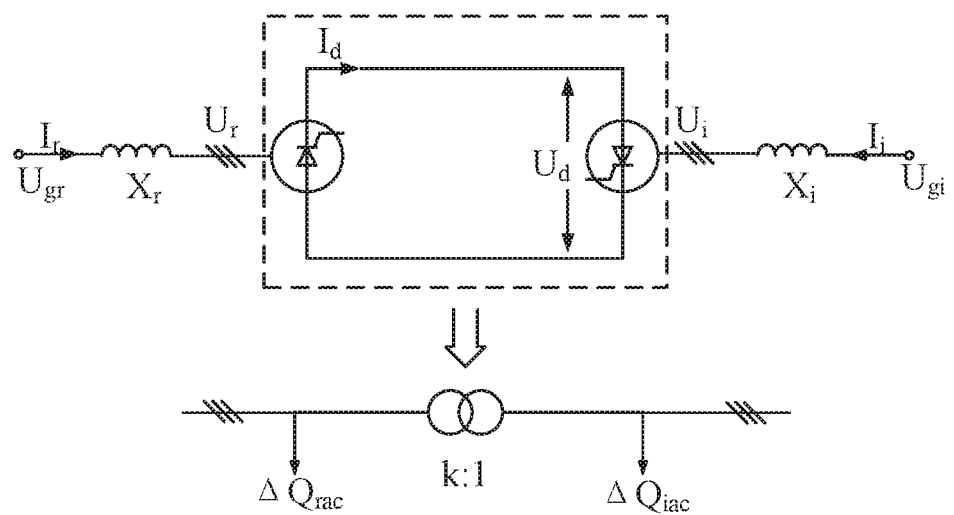
FIG. 8 shows a schematic diagram of the AC conversion of the DC transmission system parameters of a specific embodiment of the present disclosure.

In MATLAB/Simulink simulation software, the sum of the equivalent model of the impedance parameter matrix of the full line of the AC/DC hybrid system model shown in FIG. 6 and the equivalent reactance model of the converter station shown in FIG. 7 are respectively established, wherein the $U_{drac}$ represents the rectifier output voltage, the $U_{drac}$ represents the inverter output voltage, so as to realize the AC conversion process of AC/DC hybrid system model parameters as shown in FIG. 8.

The power flow calculation based on the equivalent model of the impedance parameter matrix of the full line and the equivalent reactance model of the converter station comprises:

calculating the ratio $k_{irqi}$ of the AC current reactive component $I_{rq}$ on rectification side of the DC transmission system and the effective value $I_{dac}$ of the DC current equivalent AC current of the DC transmission system, and the ratio $k_{iipi}$ of the AC current reactive component $I_{iq}$ on inverter side of the DC transmission system and the effective value $I_{dac}$ of the DC current equivalent AC current of the DC transmission system.

Based on the following formula (6)

$$\begin{cases} \Delta Q_{rac} = k_{iur} k_{irqi} U_r^2 \\ \Delta Q_{iac} = k_{iui} k_{iiqi} U_i^2 \end{cases} \quad (6)$$

based on the principle that the power before and after the equivalent is unchanged, the converter station is regarded as a reactive load, the DC transmission system parameters are equivalent to AC parameters, and the power of the DC transmission system is averaged to three-phase AC, based on the following formula (7):

$$I_{dac} = \frac{1}{3} \angle \varphi_{ur} \quad (7)$$

the DC transmission system DC current $I_d$ is equivalent to AC current $I_{dac}$, the effective value is one third of the DC current of the DC transmission system, the phase $\varphi_{ur}$ is the same as the voltage phase on rectification side of the DC transmission system.

The simulation duration of the full line of the impedance parameter matrix equivalent model and the equivalent reactance model of the converter station is 10 s, and the power flow distribution of the AC/DC hybrid line is obtained, as shown in Table 2, compared with the simulation results of the AC/DC hybrid system model, the maximum error of the equivalent model of the impedance parameter matrix of the full line is 4.7486%, and the maximum error of the equivalent reactance model of the converter station is 2.6409%. The running time (the time required to solve the model) of the equivalent model of the impedance parameter matrix of the full line is 0.64 s, and the running time of the equivalent reactance model of the converter station is 1.64 s, which is much less than the running time of the AC/DC hybrid system model of 17 min 50.40 s.

TABLE 2

| simulation results | equivalent model of the impedance parameter matrix of the full line | | equivalent reactance model of the converter station | |
|---|---|---|---|---|
| of the AC/DC hybrid system model | simulation results | error (%) | simulation results | error (%) |
| $I_r$ (A)  840.0428 | 827.3149 | −1.5151 | 828.0220 | −1.4310 |
| $I_i$ (A)  828.0220 | 799.0307 | −3.5013 | 816.7083 | −1.3853 |
| $U_r$ (kV) 196.9999 | 197.8485 | 0.4308 | 197.6363 | 0.3230 |
| $U_i$ (kV) 213.8291 | 214.7483 | 0.4299 | 214.5362 | 0.3307 |
| $\cos \varphi_r$  0.8714 | 0.8679 | −0.4016 | 0.8645 | −0.7918 |
| $\cos \varphi_i$  0.7876 | 0.8250 | 4.7486 | 0.8084 | 2.6409 |

Wherein, $I_r$ represents the effective value of the AC current on rectification side, $I_i$ represents the effective value of the AC current on rectification side, $\cos \varphi_r$ represents the power factor on rectification side, and $\cos \varphi_i$ represents the power factor on inverter side.

In this embodiment, the DC transmission system structural parameters and control parameters are used to obtain the AC equivalent model of the high-voltage DC transmission system with the AC reactance equivalent converter station, and the power flow analysis and calculation of the AC/DC hybrid power grid is carried out, the power flow analysis and calculation problem of the AC/DC hybrid power grid is transformed into the power flow analysis and calculation problem of the pure AC power grid, which overcomes the problem that the existing methods cannot balance efficiency and accuracy in the power flow analysis and calculation of AC/DC hybrid power grid. Compared with the simulation results of the AC/DC hybrid system model, the maximum error of the equivalent model of the impedance parameter matrix of the full line is 4.7486%, and the maximum error of the equivalent reactance model of the converter station is 2.6409%. The running time of the equivalent model of the impedance parameter matrix of the full line is 0.64 s, and the running time of the equivalent reactance model of the converter station is 1.64 s, which is much less than the running time of the AC/DC hybrid system model of 17 min50.40 s. Thereby it can quickly, correctly and conveniently analyze and calculate the power flow distribution of the complex AC/DC hybrid power grid during steady-state operation to make the power flow calculation have higher sensitivity and reliability.

In the description of the present specification, the terms "first" and "second" are used only for the purpose of description, and cannot be understood as indicating or implying relative importance, unless otherwise explicitly stated and limited. The terms "connection", "mounting", "fixing" and the like should be understood in a broad sense. For example, "connection" may be a fixed connection, a removable connection or an integral connection; and may refer to direct connection and may also refer to indirect connection through an intermediary. A person of ordinary skills in the art could understand the specific meaning of the terms in the present disclosure according to specific situations.

In the description of the present specification, the descriptions of the terms "one embodiment", "some embodiments" and "specific embodiments" and the like mean that specific features, structures, materials or characteristics described in conjunction with the embodiment(s) or example(s) are included in at least one embodiment or example of the present disclosure. In the specification, the schematic representation of the above terms does not necessarily refer to the same embodiment or example. Moreover, the particular features, structures, materials or characteristics described may be combined in a suitable manner in any one or more embodiments or examples.

The descriptions above are only preferred embodiments of the present disclosure, which are not used to limit the present disclosure. For a person skilled in the art, the present disclosure may have various changes and variations. Any modifications, equivalent substitutions, improvements etc. within the spirit and principle of the present disclosure shall all be included in the protection scope of the present disclosure.

What is claimed is:

1. A power flow analysis device for an AC/DC hybrid system, the AC/DC hybrid system comprises a DC transmission system, the DC transmission system comprises a converter station having a rectifier and an inverter, wherein the power flow analysis device comprises:
    a memory being stored a computer program; and
    a processor performing the following steps when executing the computer program:
    obtaining an AC system voltage and a commutation reaction of the DC transmission system, a first trigger angle of the rectifier, and a second trigger angle of the inverter;
    constructing an AC equivalent model according to the AC system voltage, the commutation reaction, the first trigger angle, and the second trigger angle; and
    performing a power flow calculation according to the AC equivalent model to obtain a power flow analysis result of the AC/DC hybrid system.

2. The power flow analysis device for the AC/DC hybrid system according to claim 1, wherein
    the commutation reaction comprises a commutation reaction on rectification side and a commutation reaction on inverter side,
    the processor executes a step of constructing an AC equivalent model according to the AC system voltage, the commutation reaction, the first trigger angle and the second trigger angle when executing the computer program,
    the step specifically comprises:
    determining an equivalent transformation ratio of the DC transmission system according to the AC system voltage, the commutation reaction on rectification side, the commutation reaction on inverter side, the first trigger angle, and the second trigger angle;
    according to the commutation reaction on rectification side, the commutation reaction on inverter side, the first trigger angle, the second trigger angle and the equivalent transformation ratio, to calculate a first ratio of an effective value of equivalent AC current of the DC transmission system and an AC voltage of the DC transmission system, and a second ratio of an AC current active component of the DC transmission system and the effective value of equivalent AC current respectively;

calculating a third ratio of an AC current reactive component of the DC transmission system and the effective value of equivalent AC current according to the second ratio;

calculating an AC reactance according to the first ratio and the third ratio; and constructing the AC equivalent model according to the AC reactance.

3. The power flow analysis device for the AC/DC hybrid system according to claim 2, wherein the AC voltage comprises an AC voltage on rectification side and an AC voltage on inverter side;

the processor executes a step of calculating a first ratio of the effective value of equivalent AC current of the DC transmission system and the AC voltage of the DC transmission system when executing the computer program, the step specifically comprises:

the formula (1) is used to calculate a first ratio on rectification side of the effective value of equivalent AC current and the AC voltage on rectification side, and a first ratio on inverter side of the effective value of equivalent AC current and the AC voltage on inverter side;

$$\begin{cases} k_{iur} = \dfrac{\sqrt{6}\left(\cos\alpha - \dfrac{\cos\beta}{k}\right)}{3(X_r + X_i)} \\ k_{iur} = \dfrac{\sqrt{6}\,(k\cos\alpha - \cos\beta)}{3(X_r + X_i)} \end{cases} \quad (1)$$

in the formula, $k_{iur}$ represents the first ratio on rectification side, $k_{iur}$ represents the first ratio on inverter side, $\alpha$ represents the first trigger angle, $\beta$ represents the second trigger angle, k represents the equivalent transformation ratio, and $X_r$ represents the commutation reaction on rectification side, $X_i$ represents the commutation reaction on inverter side, the AC current active component comprises an AC current active component on rectification side and an AC current active component on inverter side;

the processor executes a step of calculating a second ratio of the AC current active component and the effective value of equivalent AC current when executing the computer program, the step specifically comprises:

the formula (2) is used to calculate a second ratio on rectification side of the AC current active component on rectification side and the effective value of equivalent AC current, and a second ratio on inverter side of the AC current active component on inverter side and the effective value of equivalent AC current;

$$\begin{cases} k_{irpi} = \dfrac{3\sqrt{6}\left(X_i\cos\alpha + \dfrac{X_r\cos\beta}{k}\right)}{\pi(X_r + X_i)} \\ k_{iipi} = \dfrac{3\sqrt{6}\,(kX_i\cos\alpha + X_r\cos\beta)}{\pi(X_r + X_i)} \end{cases} \quad (2)$$

in the formula, $k_{irpi}$ represents the second ratio on rectification side, and $k_{iipi}$ represents the first ratio on inverter side;

the AC current reactive component comprises an AC current reactive component on rectification side and an AC current reactive component on inverter side;

the processor executes a step of calculating a third ratio of the AC current reactive component of the DC transmission system and the effective value of equivalent AC current according to the second ratio when executing the computer program, the step specifically comprises:

the formula (3) is used to calculate a third ratio on rectification side of the AC current reactive component on rectification side and the effective value of equivalent AC current according to the second ratio on rectification side, and to calculate a third ratio on inverter side of the AC current reactive component on inverter side and the effective value of equivalent AC current according to the second ratio on inverter side;

$$\begin{cases} k_{irqi} = \sqrt{6 - k_{irpi}^2} \\ k_{iiqi} = \sqrt{6 - k_{irpi}^2} \end{cases} \quad (3)$$

in the formula, $k_{irqi}$ represents the third ratio on rectification side, and $k_{iipi}$ represents the third ratio on inverter side.

4. The power flow analysis device for the AC/DC hybrid system according to claim 3, wherein the processor executes a step of calculating the AC reactance according to the first ratio and the third ratio when executing the computer program, the step specifically comprises:

the formula (4) is used to calculate a first AC reactance, a second AC reactance and a third AC reactance;

$$\begin{cases} X_1 = \dfrac{k-1}{kk_{iur}k_{irqi} + k_{iui}k_{iiqi}} \\ X_2 = \dfrac{1-k}{k(kk_{iur}k_{irqi} + k_{iui}k_{iiqi})} \\ X_3 = \dfrac{1}{kk_{iur}k_{irqi} + k_{iui}k_{iiqi}} \end{cases} \quad (4)$$

in the formula, $X_1$ represents the first AC reactance, $X_2$ represents the second AC reactance, and $X_3$ represents the third AC reactance; and/or the formula (5) is used to calculate a fourth AC reactance and a fifth AC reactance;

$$\begin{cases} X_{qr} = \dfrac{1}{k_{iur}k_{irqi}} \\ X_{qi} = \dfrac{1}{k_{iui}k_{iiqi}} \end{cases} \quad (5)$$

in the formula, $X_{qr}$ represents the fourth AC reactance, and $X_{qi}$ represents the fifth AC reactance.

5. The power flow analysis device for the AC/DC hybrid system according to claim 3, wherein the processor executes a step of performing a power flow calculation according to the AC equivalent model to obtain a power flow analysis result of the AC/DC hybrid system when executing the computer program, the step specifically comprises:
solving the AC equivalent model to obtain an effective value of AC voltage and a DC voltage of the DC transmission system;
calculating a reactive loss of the rectifier and a reactive loss of the inverter according to the effective value of AC voltage, the first ratio and the third ratio;
calculating an equivalent AC current according to the DC current and a voltage phase on rectification side, and determining the effective value of equivalent AC current according to the equivalent AC current; and
generating the power flow analysis result of the AC/DC hybrid system according to the effective value of equivalent AC current, the reactive loss of the rectifier and the reactive loss of the inverter;
wherein the formula (6) is used to calculate the reactive loss of the rectifier and the reactive loss of the inverter;

$$\begin{cases} \Delta Q_{rac} = k_{iur} k_{irqi} U_r^2 \\ \Delta Q_{iac} = k_{iui} k_{iiqi} U_i^2 \end{cases} \quad (6)$$

in the formula, $\Delta Q_{rac}$ represents the reactive loss of the rectifier, $\Delta Q_{iac}$ represents the reactive loss of the inverter, $U_r$ represents the effective value of AC voltage on rectification side, $U_i$ represents the effective value of AC voltage on inverter side;
the formula (7) is used to calculate the equivalent AC current;

$$I_{dac} = \frac{1}{3} I_d \varphi_{ur} \quad (7)$$

in the formula, $\varphi_{ur}$ represents the voltage phase on rectification side, $I_d$ represents the DC current of the DC transmission system, and $I_{dac}$ represents the equivalent AC current.

6. A power flow analysis method for an AC/DC hybrid system, the AC/DC hybrid system comprises a DC transmission system, the DC transmission system comprises a converter station having a rectifier and an inverter, wherein the power flow analysis method comprises the following steps:
obtaining an AC system voltage and a commutation reaction of the DC transmission system, a first trigger angle of the rectifier, and a second trigger angle of the inverter;
constructing an AC equivalent model according to the AC system voltage, the commutation reaction, the first trigger angle, and the second trigger angle; and
performing a power flow calculation according to the AC equivalent model to obtain a power flow analysis result of the AC/DC hybrid system.

7. The power flow analysis method for the AC/DC hybrid system according to claim 6, wherein
the commutation reaction comprises a commutation reaction on the rectification side and a commutation reaction on inverter side,
executing a step of constructing an AC equivalent model according to the AC system voltage, the commutation reaction, the first trigger angle and the second trigger angle, the step specifically comprises:
determining an equivalent transformation ratio of the DC transmission system according to the AC system voltage, the commutation reaction on rectification side, the commutation reaction on inverter side, the first trigger angle, and the second trigger angle;
according to the commutation reaction on rectification side, the commutation reaction on inverter side, the first trigger angle, the second trigger angle and the equivalent transformation ratio, to calculate a first ratio of an effective value of equivalent AC current of the DC transmission system and an AC voltage of the DC transmission system, and a second ratio of an AC current active component of the DC transmission system and the effective value of equivalent AC current respectively;
calculating a third ratio of an AC current reactive component of the DC transmission system and the effective value of equivalent AC current according to the second ratio;
calculating an AC reactance according to the first ratio and the third ratio; and
constructing the AC equivalent model according to the AC reactance.

8. The power flow analysis method for the AC/DC hybrid system according to claim 7, wherein
the AC voltage comprises an AC voltage on rectification side and an AC voltage on inverter side;
executing a step of calculating a first ratio of the effective value of equivalent AC current of the DC transmission system and the AC voltage of the DC transmission system,
the step specifically comprises:
the formula (1) is used to calculate a first ratio on rectification side of the effective value of equivalent AC current and the AC voltage on rectification side, and a first ratio on inverter side of the effective value of equivalent AC current and the AC voltage on inverter side;

$$\begin{cases} k_{iur} = \dfrac{\sqrt{6}\left(\cos\alpha - \dfrac{\cos\beta}{k}\right)}{3(X_r + X_i)} \\ k_{iur} = \dfrac{\sqrt{6}\,(k\cos\alpha - \cos\beta)}{3(X_r + X_i)} \end{cases} \quad (1)$$

in the formula, $k_{iur}$ represents the first ratio on rectification side, $k_{iur}$ represents the first ratio on inverter side, $\alpha$ represents the first trigger angle, $\beta$ represents the second trigger angle, k represents the equivalent transformation ratio, and $X_r$ represents the commutation reaction on rectification side, $X_i$ represents the commutation reaction on inverter side,
the AC current active component comprises an AC current active component on rectification side and an AC current active component on inverter side;
executing a step of calculating a second ratio of the AC current active component and the effective value of equivalent AC current,
the step specifically comprises:
the formula (2) is used to calculate a second ratio on rectification side of the AC current active component on rectification side and the effective value of equivalent AC current, and a second ratio on inverter side of the AC current active component on inverter side and the effective value of equivalent AC current;

$$\begin{cases} k_{irpi} = \dfrac{3\sqrt{6}\left(X_i\cos\alpha + \dfrac{X_r\cos\beta}{k}\right)}{\pi(X_r + X_i)} \\ k_{iipi} = \dfrac{3\sqrt{6}\,(kX_i\cos\alpha + X_f\cos\beta)}{\pi(X_r + X_i)} \end{cases} \quad (2)$$

wherein, $k_{irpi}$ represents the second ratio on rectification side, and $k_{iipi}$ represents the first ratio on inverter side;

the AC current reactive component comprises an AC current reactive component on rectification side and an AC current reactive component on inverter side;

executing a step of calculating a third ratio of the AC current reactive component of the DC transmission system and the effective value of equivalent AC current according to the second ratio, the step specifically comprises:

the formula (3) is used to calculate a third ratio on rectification side of the AC current reactive component on rectification side and the effective value of equivalent AC current according to the second ratio on rectification side, and to calculate a third ratio on inverter side of the AC current reactive component on inverter side and the effective value of equivalent AC current according to the second ratio on inverter side;

$$\begin{cases} k_{irqi} = \sqrt{6 - k_{irpi}^2} \\ k_{iiqi} = \sqrt{6 - k_{irpi}^2} \end{cases} \quad (3)$$

wherein, $k_{irqi}$ represents the third ratio on rectification side and $k_{iipi}$ represents the third ratio on inverter side.

9. The power flow analysis method for the AC/DC hybrid system according to claim 8, wherein executing a step of calculating the AC reactance according to the first ratio and the third ratio, the step specifically comprises:

the formula (4) is used to calculate a first AC reactance, a second AC reactance and a third AC reactance;

$$\begin{cases} X_1 = \dfrac{k-1}{kk_{iur}k_{irqi} + k_{iui}k_{iiqi}} \\ X_2 = \dfrac{1-k}{k(kk_{iur}k_{irqi} + k_{iui}k_{iiqi})} \\ X_3 = \dfrac{1}{kk_{iur}k_{irqi} + k_{iui}k_{iiqi}} \end{cases} \quad (4)$$

in the formula, $X_1$ represents the first AC reactance, $X_2$ represents the second AC reactance, and $X_3$ represents the third AC reactance; and/or the formula (5) is used to calculate a fourth AC reactance and a fifth AC reactance;

$$\begin{cases} X_{qr} = \dfrac{1}{k_{iur}k_{irqi}} \\ X_{qi} = \dfrac{1}{k_{iui}k_{iiqi}} \end{cases} \quad (5)$$

in the formula, $X_{qr}$ represents the fourth AC reactance, and $X_{qi}$ represents the fifth AC reactance.

10. The power flow analysis method for the AC/DC hybrid system according to claim 8, wherein executing a steps of performing a power flow calculation according to the AC equivalent model to obtain a power flow analysis result of the AC/DC hybrid system, the step specifically comprises:

solving the AC equivalent model to obtain an effective value of AC voltage and a DC voltage of the DC transmission system;

calculating a reactive loss of the rectifier and a reactive loss of the inverter according to the effective value of AC voltage, the first ratio and the third ratio;

calculating an equivalent AC current according to the DC current and a voltage phase on rectification side, and determining the effective value of equivalent AC current according to the equivalent AC current; and generating the power flow analysis result of the AC/DC hybrid system according to the effective value of equivalent AC current, the reactive loss of the rectifier and the reactive loss of the inverter;

wherein the formula (6) is used to calculate the reactive loss of the rectifier and the reactive loss of the inverter;

$$\begin{cases} \Delta Q_{rac} = k_{iur}k_{irqi}U_r^2 \\ \Delta Q_{iac} = k_{iui}k_{iiqi}U_i^2 \end{cases} \quad (6)$$

in the formula, $\Delta Q_{rac}$ represents the reactive loss of the rectifier, $\Delta Q_{iac}$ represents the reactive loss of the inverter, $U_r$ represents the effective value of AC voltage on rectification side, $U_i$ represents the effective value of AC voltage on inverter side;

the formula (7) is used to calculate the equivalent AC current;

$$\dot{I}_{dac} = \dfrac{I}{3}\angle\varphi_{ur} \quad (7)$$

in the formula, $\varphi_{ur}$ represents the voltage phase on rectification side, $I_d$ represents the DC current of the DC transmission system, and $\dot{I}_{dac}$ represents the equivalent AC current.

* * * * *